United States Patent
Grace et al.

(10) Patent No.: US 7,465,475 B2
(45) Date of Patent: *Dec. 16, 2008

(54) METHOD FOR CONTROLLING THE DEPOSITION OF VAPORIZED ORGANIC MATERIAL

(75) Inventors: Jeremy M. Grace, Penfield, NY (US); Michael Long, Hilton, NY (US); Michael L. Boroson, Rochester, NY (US); Jinmei Zhang, Pittsford, NY (US); Bruce E. Koppe, Caledonia, NY (US); Thomas W. Palone, Rochester, NY (US); Neil P. Redden, Sodus Point, NY (US)

(73) Assignee: Eastman Kodak Company, Rochester, NY (US)

( * ) Notice: Subject to any disclaimer, the term of this patent is extended or adjusted under 35 U.S.C. 154(b) by 585 days.

This patent is subject to a terminal disclaimer.

(21) Appl. No.: 10/984,667

(22) Filed: Nov. 9, 2004

(65) Prior Publication Data

US 2006/0099345 A1     May 11, 2006

(51) Int. Cl.
    *C23C 16/448*     (2006.01)
(52) U.S. Cl. ............... 427/248.1; 427/255.6; 118/724
(58) Field of Classification Search ............... 427/255.6, 427/66; 118/724
    See application file for complete search history.

(56) References Cited

U.S. PATENT DOCUMENTS

| | | | |
|---|---|---|---|
| 2,447,789 A | | 8/1948 | Barr |
| 3,928,659 A | * | 12/1975 | Baxter ....................... 427/132 |
| 4,724,106 A | * | 2/1988 | Morimoto et al. ........... 264/439 |
| 5,804,259 A | * | 9/1998 | Robles ....................... 427/577 |
| 5,860,279 A | * | 1/1999 | Bronicki et al. ............... 60/655 |
| 5,869,135 A | * | 2/1999 | Vaeth et al. ............ 427/255.14 |
| 5,900,279 A | * | 5/1999 | Hideaki et al. ........... 427/248.1 |
| 5,904,961 A | * | 5/1999 | Tang et al. ................... 427/561 |
| 6,051,321 A | * | 4/2000 | Lee et al. .................... 428/447 |
| 6,237,529 B1 | * | 5/2001 | Spahn ........................ 118/726 |
| 6,337,102 B1 | * | 1/2002 | Forrest et al. ................. 427/64 |
| 6,709,524 B2 | * | 3/2004 | Kawashima ................ 118/726 |
| 6,749,906 B2 | * | 6/2004 | Van Slyke ................... 427/591 |
| 6,837,939 B1 | * | 1/2005 | Klug et al. .................. 118/726 |
| 6,844,891 B1 | * | 1/2005 | Kay et al. .................... 347/234 |
| 7,036,801 B2 | * | 5/2006 | Takamatsu et al. .......... 261/142 |
| 7,232,588 B2 | * | 6/2007 | Long et al. ............... 427/248.1 |
| 2004/0086628 A1 | | 5/2004 | Swanson |
| 2004/0156987 A1 | * | 8/2004 | Yim et al. ................. 427/255.6 |
| 2005/0186340 A1 | | 8/2005 | Long et al. |

FOREIGN PATENT DOCUMENTS

| EP | 0982411 | 3/2000 |
|---|---|---|
| JP | 09-219289 | 8/1997 |

* cited by examiner

*Primary Examiner*—Bret Chen
(74) *Attorney, Agent, or Firm*—Raymond L. Owens

(57) ABSTRACT

A method for controlling the deposition of vaporized organic material onto a substrate surface, includes providing a heating device to produce vaporized organic material; providing a manifold having at least one aperture through which vaporized organic material passes for deposition onto the substrate surface; providing a controller operating independently of the heating device and effective in a first condition for limiting the passage of vaporized organic material through the aperture, and effective in a second condition for facilitating the passage of vaporized organic material through the aperture; and wherein the heating device, or the controller, or both are contiguous to the manifold.

8 Claims, 8 Drawing Sheets

METHOD FOR CONTROLLING THE DEPOSITION OF VAPORIZED ORGANIC MATERIAL

CROSS REFERENCE TO RELATED APPLICATIONS

Reference is made to commonly assigned U.S. patent application Ser. No. 10/805,847, filed Mar. 22, 2004, entitled "High Thickness Uniformity Vaporization Source" by Long et al, U.S. patent application Ser. No. 10/945,940, filed Sep. 21, 2004, entitled "Delivering Organic Powder to a Vaporization Zone" by Long et al and U.S. patent application Ser. No. 10/984,095 filed Nov. 9, 2004, entitled "Controlling the Vaporization of Organic Material" by Boroson et al the disclosures of which are incorporated herein by reference.

FIELD OF THE INVENTION

The present invention relates to the field of physical vapor deposition where a source material is heated to a temperature so as to cause vaporization and create a vapor plume to form a thin film on a surface of a substrate.

BACKGROUND OF THE INVENTION

Physical vapor deposition in a vacuum environment is a commonly used way of depositing thin organic material films, for example in small molecule OLED devices. Such methods are well known, for example Barr in U.S. Pat. No. 2,447,789 and Tanabe et al. in EP 0 982 411. The organic materials are often subject to degradation when maintained at or near the desired rate-dependent vaporization temperature for extended periods of time. Exposure of sensitive organic materials to higher temperatures can cause changes in the structure of the molecules and associated changes in material properties.

The organic materials used in OLED devices have a highly non-linear dependence of vaporization rate on source temperature. A small change in source temperature leads to a very large change in vaporization rate. Despite this, prior art devices employ source temperature as the only way to control vaporization rate. To achieve good temperature control, prior art deposition sources typically utilize heating structures whose solid volume is much larger than the organic charge volume, composed of high thermal-conductivity materials that are well insulated. The high thermal conductivity insures good temperature uniformity through the structure and the large thermal mass helps to maintain the temperature within a critically small range by reducing temperature fluctuations. These measures have the desired effect on steady-state vaporization rate stability but have a detrimental effect at start-up. It is common that these devices must operate for long periods of time (e.g. 2-12 hours) at start-up before steady state temperature distribution and hence a steady vaporization rate is achieved. It is also common that these devices also require long times to cool down, and thus significant amounts of organic material, some of which can be expensive or difficult to synthesize, can be lost. Furthermore the steady state slowly drifts as material is consumed from the sources, and input power must be changed (in order to alter the temperature distribution) to maintain a constant vaporization rate.

The current method to minimize material time at high temperature and to maximize machine operation time by minimizing the start-up and cool-down times of the material-containing sources requires using duplicate sources of the same material sequentially. For example, rather than using one source continuously for eight days, two sources can be used for four days each or eight sources can be used in a serial process for one day each by overlapping the start-up and cool-down times. Duplicate sources, however, increase equipment size and cost, especially if the number of duplicate sources or the number of materials that require duplicate sources is large.

Forrest et al. (U.S. Pat. No. 6,337,102 B1) disclose a method for vaporizing organic materials and organic precursors and delivering them to a reactor vessel wherein the substrate is situated, and delivery of the vapors generated from solids or liquids is accomplished by use of carrier gases. The organic materials are held at a constant temperature that is high enough to saturate the incoming carrier gas at all possible flow rates. Deposition rate is controlled by adjusting the carrier-gas flow rate. In one embodiment of their invention, Forrest et al. locate the substrates within a suitably large reactor vessel, and the vapors carried thereto mix and react or condense on the substrate. Another embodiment of their invention is directed towards applications involving coating of large area substrates and putting several such deposition processes in serial fashion with one another. For this embodiment, Forrest et al. disclose the use of a gas curtain fed by a gas manifold (defined in the disclosure as "hollow tubes having a line of holes") in order to form a continuous line of depositing material perpendicular to the direction of substrate travel.

One major problem in the approach disclosed by Forrest et al. is that all of the materials are continuously heated in high thermal mass systems to maintain tight temperature control. This exposure to high temperatures for extended periods of time increases the likelihood of degradation of some materials in the same way as the methods taught by Barr and Tanabe et al. Another problem in the approach disclosed by Forrest et al. is that cool-down and start-up times to reload material are long, due to the high thermal mass of the system and the requirement that all materials be at a uniform temperature before starting the carrier gas flow.

Also known in the art are systems such as taught by Hoffman et al. of Applied Films GmbH & Co. in their paper from the Society for Information Display 2002 International Symposium, SID Digest 02 pp. 891-893. These systems combine large heated remote sources similar to the type used by Barr and Tanabe et al. with manifolds to distribute the material vapor. These systems suffer from the same problems as the methods taught by Barr, Tanabe et al., and Forrest et al. with respect to material degradation, due to long term exposure to high temperatures and long cool-down and start-up times due to the high thermal mass of the heating system.

The approaches to vapor delivery as disclosed by Forrest et al. and Hoffman et al. can be characterized as "remote vaporization" wherein a material-is converted to vapor in an apparatus external to the deposition zone and more likely external to the deposition chamber. Organic vapors, alone or in combination with carrier gases, are conveyed into the deposition chamber and ultimately to the substrate surface. Great care must be taken using this approach to avoid unwanted condensation in the delivery lines by use of appropriate heating methods. This problem becomes even more critical when contemplating the use of inorganic materials that vaporize to the desired extent at substantially higher temperatures. Furthermore, the delivery of the vaporized material for coating large areas uniformly requires the use of gas manifolds.

Current remote-vaporization methods suffer from the problems of long material exposure to high temperatures and start-up and cool-down delays due to high thermal mass heating systems; however, these systems have some advantages over the methods taught by Barr and Tanabe et al. with respect to coating uniformity and control of instantaneous deposition rates. Although these remote vaporization methods can stop deposition fairly quickly by closing valves for the carrier gases in the method of Forrest et al. or for the organic vapors in the method of Hoffman et al., the organic vapors and carrier gases downstream of the valves will continue to exit the manifold until the manifold pressure drops to the deposition chamber pressure. Likewise this method can start deposition fairly quickly but organic vapors and carrier gases will not reach steady state deposition rates until the manifold has reached steady state pressure. This is a problem due to remote vaporization combined with structures, such as valves, to control the flow of organic vapors that are also remote from and not contiguous to the manifold. These remote structures do not quickly control the passage of organic material through the manifold apertures, resulting in delays in starting and stopping deposition. Remote vaporization systems with remote valves do not resolve the significant issue of long start-up and cool-down times for loading fresh material, due to the high thermal mass of these systems, nor do they resolve the major issue of material degradation due to extended exposure to high temperature in these systems.

Furukawa et al., in Japanese Unexamined Patent Application 9-219289, disclose a method of forming an organic thin-film electroluminescent element by a flash vapor deposition method. While this method can start and stop quickly, it cannot be run as a continuous process as taught by Furukawa et al. The organic material is dropped onto a heated plate. Furakawa is silent on the nature of the powder delivery system, and how it assures that the desired quantity of powder is actually dropped on the heated plate, and therefore how vaporization rate, the deposited film thickness, and thickness uniformity are controlled. Also unclear is how the powder delivery system, with a temperature below the condensation temperature of the just-created vapor, is prevented from acting as a cold finger upon which a portion of the just-created vapor condenses.

SUMMARY OF THE INVENTION

It is therefore an object of the present invention to achieve physical vapor deposition at a steady state with short start and stop times. It is a further object that the vapor deposition can be run continuously and in any orientation. It is a further object in some embodiments to minimize the heat-promoted degradation of organic materials without resorting to large numbers of duplicate sources. It is a further object to minimize the start-up and cool-down times for reloading materials without resorting to duplicate sources.

These objects are achieved by a method for controlling the deposition of vaporized organic material onto a substrate surface, comprising:

(a) providing a heating device to produce vaporized organic material;

(b) providing a manifold having at least one aperture through which vaporized organic material passes for deposition onto the substrate surface;

(c) providing a controller operating independently of the heating device and effective in a first condition for limiting the passage of vaporized organic material through the aperture, and effective in a second condition for facilitating the passage of vaporized organic material through the aperture; and (d) wherein the heating device, or the controller, or both are contiguous to the manifold.

It is an advantage of the present invention that the deposition of organic material vapors can be started and stopped in a matter of seconds to achieve a steady vaporization rate quickly. This feature minimizes contamination of the deposition chamber walls and conserves the organic materials when a substrate is not being coated.

It is another advantage of some embodiments of the present invention that the device overcomes the heating and volume limitations of prior art devices in that only a small portion of organic material is heated to the desired rate-dependent vaporization temperature at a controlled rate. It is therefore a feature of the present invention to maintain a steady vaporization rate with a large charge of organic material and with a steady heater temperature. The device permits extended operation of the source with substantially reduced risk of degrading even very temperature-sensitive organic materials. This feature additionally permits materials having different vaporization rates and degradation temperature thresholds to be co-sublimated in the same source. This feature additionally permits short material-reloading times due to the low thermal mass of the heated material.

It is a further advantage of some embodiments of the present invention that it permits finer rate control and additionally offers an independent measure of the vaporization rate.

It is a further advantage of some embodiments that the present device achieves substantially higher vaporization rates than in prior art devices without material degradation. Further still, no heater temperature change is required as the source material is consumed.

It is a further advantage of some embodiments of the present invention that it can provide a vapor source in any orientation, which is not possible with prior-art devices.

DETAILED DESCRIPTION OF THE INVENTION

Figure 1:
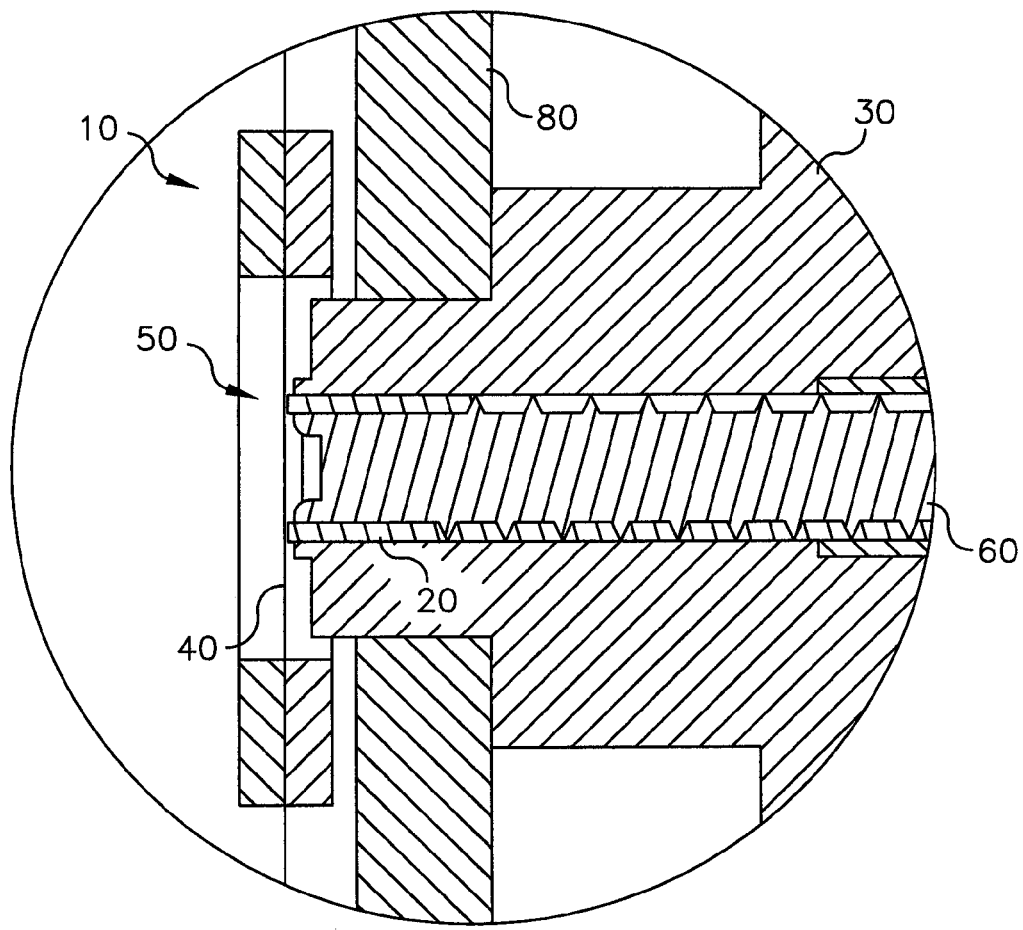
FIG. 1 shows a cross-sectional view of an apparatus for controlling the vaporization of organic material in a vaporization source onto a substrate surface in accordance with this invention.

Turning now to FIG. 1, there is shown a cross-sectional view of an apparatus for controlling the deposition of vaporized organic material onto a substrate surface by controlling the vaporization of organic material in a vaporization source onto a substrate surface in accordance with this invention. Apparatus 10 is a vaporization source and includes an initial volume of organic material 20 and a metering device 60 for advancing organic material 20 in a controlled manner from first temperature-controlled region 30 to second temperature-controlled region 50. Metering device 60 can be e.g. an auger screw or a similar auger structure. Such metering device, and way of providing a volume of organic material to them, have previously been described by Long et al. in above-cited, commonly-assigned U.S. patent application Ser. No. 10/945,940, the contents of which are incorporated by reference. First temperature-controlled region 30 can be a region of high thermal mass, e.g. a large base, and can include such materials as metals and ceramics to maintain organic material 20 at a desired temperature below its vaporization temperature. First temperature-controlled region 30 can be heated or cooled as needed and includes a first heating device, which can be any well-known heating device, e.g. heating coil, induction heating, heating/cooling tubes, and the like. The first heating device is not shown for clarity. First temperature-controlled region 30 is heated to and maintained below the vaporization temperature of organic material 20.

The vaporization temperature is defined as the lowest temperature wherein the vapor pressure of organic material 20 is sufficient to effectively form a layer of organic material on a substrate. By effectively we mean at a practical manufacturing rate. Because the vapor pressure of a material is a continuous function with respect to temperature, at any non-zero absolute temperature, the material has a non-zero vapor pressure. The above definition of vaporization temperature is useful for describing operating conditions and relative temperatures of various regions within a practical deposition device.

A related matter is that of the condensation temperature. At a given partial pressure of material, the material vapor will condense onto a surface held at or below a measurable temperature. This temperature is defined as the condensation temperature and depends on the partial pressure of the material vapor.

Apparatus 10 also provides a manifold, a portion of which is shown by manifold walls 80. The manifold includes one or more apertures through which the vaporized organic material will pass for deposition onto a substrate surface. Long et al. have discussed examples of suitable manifolds in above-cited, commonly-assigned U.S. patent application Ser. No. 10/805,847, the disclosure of which is incorporated by reference. The manifold can also consist of a single-aperture heated-wall structure similar to the type commonly referred to as point sources.

Second temperature-controlled region 50 is the region from the end of first temperature-controlled region 30 to a second heating device 40. Second heating device 40 can be a heating element that has a very low thermal mass as seen by organic material 20. Such heating elements include permeable heating elements such as wire mesh screens and reticulated porous structures including fine ligaments, and can be heated by induction, RF energy, or by conducting a current along its length. Second heating device 40 heats organic material 20 above its vaporization temperature in second temperature-controlled region 50, so that the vapor pressure of the heated organic material is sufficient to effectively form a layer on a substrate and the organic material adjacent to the permeable heating element vaporizes and is released into the manifold. Organic material 20 is metered at a predetermined controlled rate to second temperature-controlled region 50 so that organic material 20 is vaporized by heat at a controlled rate and the vaporized organic material passes through the permeable heating element, that is, second heating device 40, into the manifold and out through the manifold apertures. In this embodiment the second heating device 40 is shown inside the manifold, but for embodiments where the second heating device 40 is contiguous to the manifold, the second heating device 40 can be outside the manifold as long as the volume of the connection between the second heating device 40 and the manifold is small relative to the internal volume of the manifold. For embodiments where the heating device is distant from the manifold, the volume of the connection is not important as long as the connection is maintained above the condensation temperature of the vaporized organic material.

In practice, the vaporization of organic material 20 can be controlled by controlling the metering of organic material 20, or by controlling the temperature applied to organic material 20 at second temperature-controlled region 50, or both. A controller for controlling the temperature at second temperature-controlled region 50 and reduces a potential and thereby applies a current to second heating device 40, that reduces the RF energy applied to second heating device 40, and separates second heating device 40 and organic material 20. In order to separate second heating device 40 and organic material 20, a mechanical structure is provided for moving second heating device 40 away from organic material 20, and reversing the metering device that feed organic material 20 to second heating device 40. In a first condition, the temperature of organic material 20 is maintained below that needed to effectively form a layer on the substrate, that is, below the vaporization temperature. In a second condition, a small volume percentage of the initial volume of organic material 20 adjacent to second heating device 40 (that is, the portion between first temperature-controlled region 30 and second heating device 40) is heated above the vaporization temperature so that the vapor pressure of the heated organic material is sufficient to effectively form a layer on a substrate placed near the apertures of the manifold. FIG. 1 is in the second condition when second heating device 40 is heated as described above. Thus, all organic material is contained in a single source while only a small volume percentage (less than 10%) of the initial volume of organic material is heated to the vaporization temperature at any time. This reduces the likelihood of material degradation.

Figure 2:
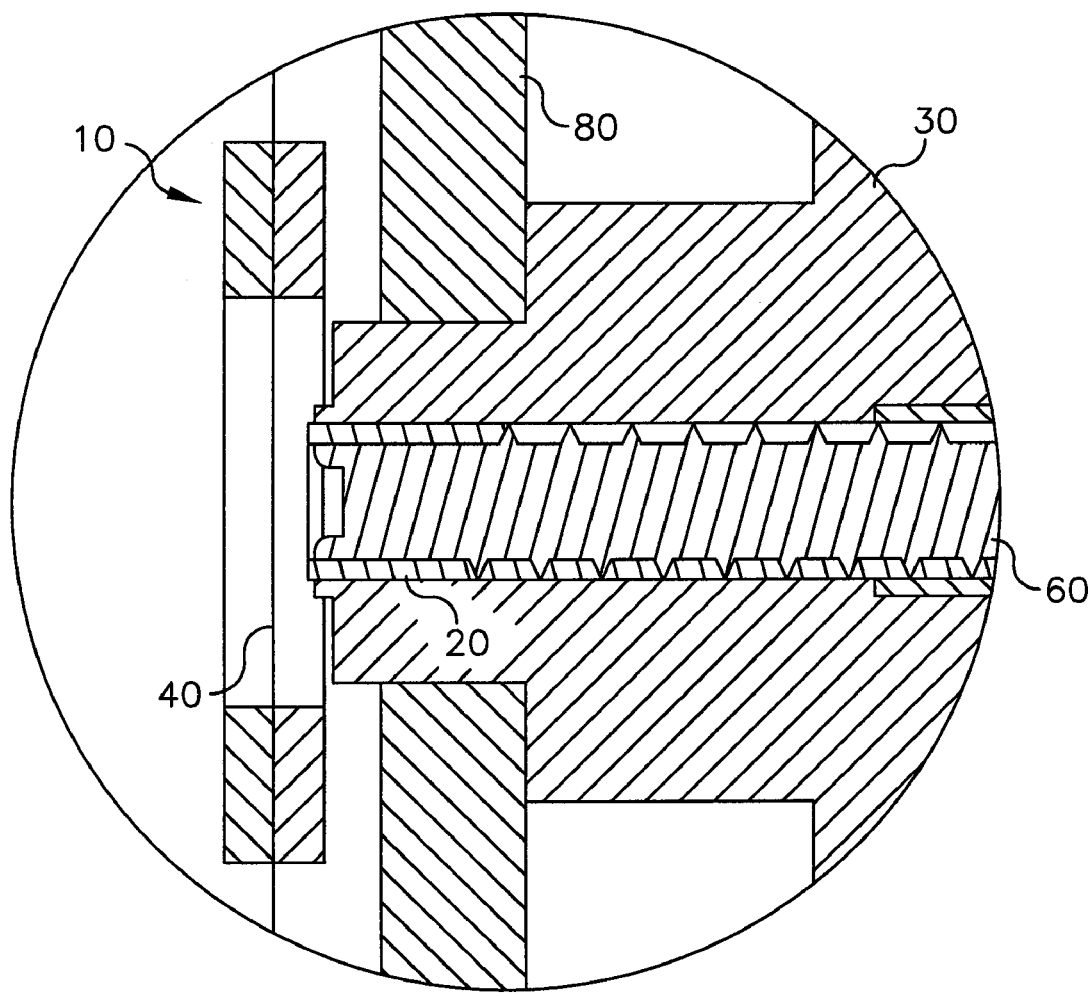
FIG. 2 shows a cross-sectional view of the above apparatus in a configuration for controlling the vaporization of organic material in accordance with this invention.

To rapidly reduce the vaporization of organic material 20, apparatus 10 is put into the first condition. This can be achieved by decreasing the heat from second heating device 40 (e.g. by reducing a potential applied to it so as to reduce the current through it), or by separating second heating device 40 from organic material 20, or both. FIG. 2 shows a cross-sectional view of the above apparatus 10 where heating device 40 has been moved away from organic material 20 so that apparatus 10 is in the first condition and organic material is not being vaporized. Alternatively, heating device 40 can be stationary and organic material 20 can be moved away from the heating device, e.g. by reversing metering device 60. This can change the vaporization rate from greater than 90% of the maximum rate to less than 10% of the maximum rate in less than 5 minutes, and times less than 3 seconds can be achieved. One can also cool organic material 20, e.g. by cooling first temperature-controlled region 30. One can use any combination of these techniques to quickly reduce the vaporization rate of organic material 20.

The ability to reduce the vaporization rate quickly is attained by several features of this invention that provide a thermal time constant of the vaporization process on the order of one second. Heating device 40 is thin and thus has a low thermal mass in contact with organic material 20. Metering device 60 feeds organic material 20 in the shape of a thin cylinder, such that organic material 20 has a small cross-sectional area in second temperature-controlled region 50, but has a much larger area in contact with first temperature-controlled region 30, which can act as a heat sink.

Figure 3:
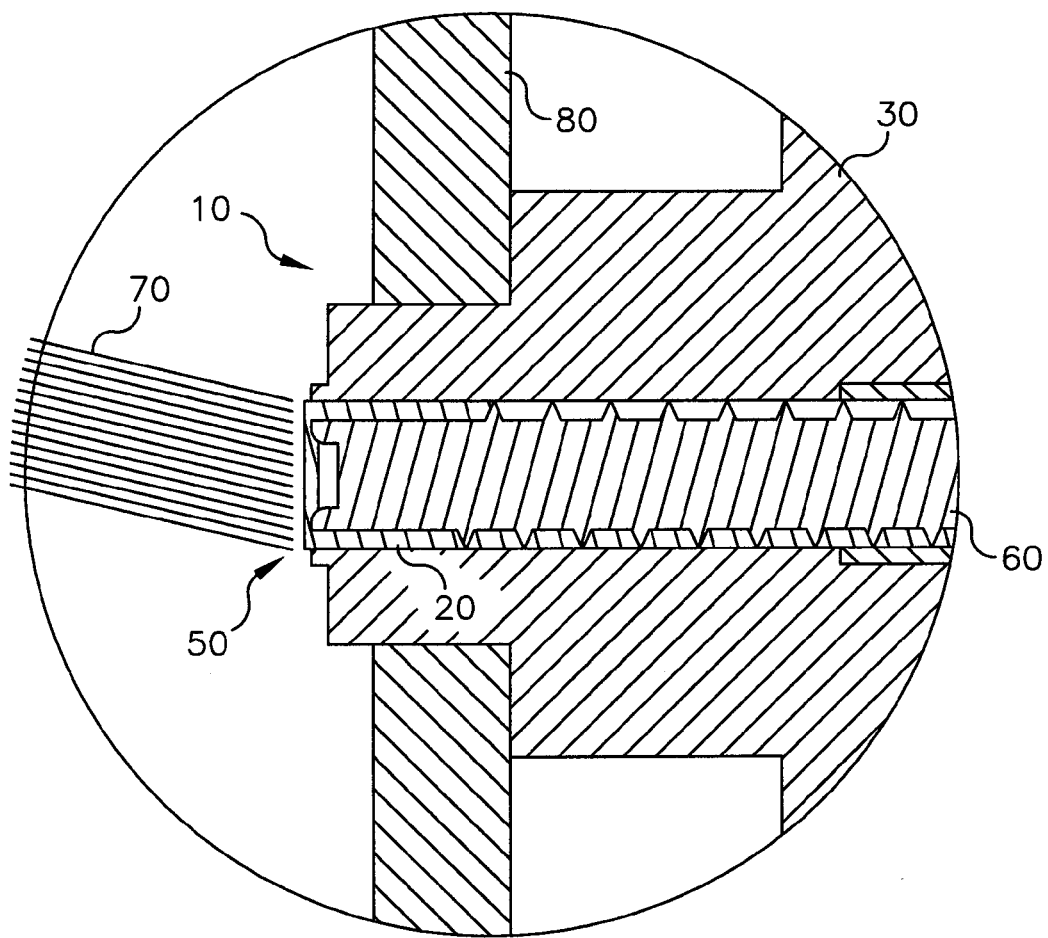
FIG. 3 shows a cross-sectional view of another apparatus for controlling the vaporization of organic material in a vaporization source onto a substrate surface in accordance with this invention.

Turning now to FIG. 3, there is shown a cross-sectional view of another apparatus for controlling the vaporization of organic material in a vaporization source onto a substrate surface in accordance with this invention, showing an alternative way of applying heat to organic material 20. Focused radiation 70 is applied onto an exposed surface of organic material 20 and heats a small volume percentage of the initial volume of organic material 20 to vaporization in the second condition of apparatus 10. Thus, all organic material is contained in a single source while only a small volume percentage (less than 10%) of the initial volume of organic material is heated to the vaporization temperature at any time. This reduces the likelihood of material degradation. Radiation 70 can be applied by a microwave device, an infrared device, or the like. In the first condition, radiation 70 is turned off. Radiation 70 can be turned off or on in a fraction of a second, thus stopping or starting vaporization of organic material 20 in a matter of seconds. Thus this method can rapidly control the application of vaporized organic material onto a substrate surface by rapidly controlling the vaporization of the organic material 20 in the vaporization source.

Figure 4:
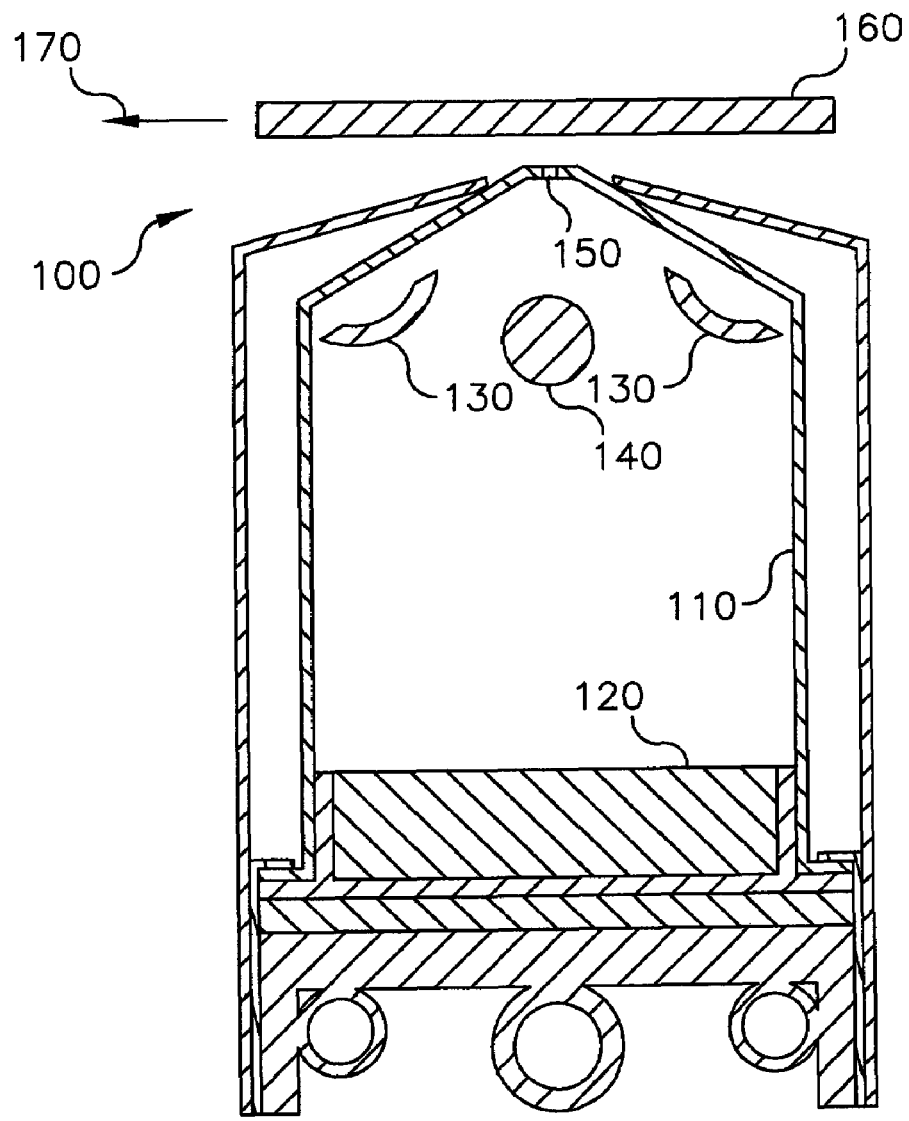
FIG. 4 shows a cross-sectional view of an apparatus for controlling the deposition of vaporized organic material onto a substrate surface from a vaporization source in accordance with this invention.

Turning now to FIG. 4, there is shown a cross-sectional view of an apparatus for controlling the deposition of vaporized organic material onto a substrate surface from a vaporization source in accordance with this invention. Apparatus 100 is a vaporization source that includes manifold 10 for containing a quantity of vaporized organic material. Manifold 110 includes one or more apertures 150 through which the vaporized organic material passes for deposition onto the surface of substrate 160. Substrate 160 can be moved in direction 170 so as to sequentially coat the entire substrate surface. Apparatus 100 further includes organic material 120 and a heating device 130, for example radiant heaters, to heat all or a portion of organic material 120 above its vaporization temperature. Although apparatus 100 is shown with a charge of organic material 120, it can be constructed instead to meter organic material into manifold 110 and heat the metered materials, for example by an auger structure and permeable heating element, as shown in other embodiments of this invention. Thus, all organic material is contained in a single source while either all of the organic material or only a small volume percentage (less than 10%) of the initial volume of organic material is heated to the vaporization temperature at any time. For embodiments where only a small volume percentage (less than 10%) of the initial volume of organic material is heated to the vaporization temperature at any time, the likelihood of material degradation is reduced.

Apparatus 100 further provides hollow member 140 positioned in manifold 110 in the flow path of vaporized organic material. Hollow member 140 is a structure operating independently of heating device 130 and is effective in a first condition for limiting the passage of vaporized organic material through apertures 150, and effective in a second condition for facilitating the passage of organic material through aperture 150. The outside surface of hollow member 140 is a temperature-control surface, by which we mean that the temperature of the outside surface of hollow member 140 and thereby its immediate surroundings can be controlled by temperature-controlling material (e.g. refrigerant fluid such as chlorofluorocarbons) that can be delivered at a controlled temperature through the interior of hollow member 140 by a structure for delivering such temperature-controlling material (e.g. a pump or compressor) so as to absorb heat from or deliver heat to hollow member 140. In a first condition, hollow member 140 is cooled so as to cause the deposition of vaporized organic material onto the surface of hollow member 140 and not onto the surface of substrate 160. Under these conditions, organic material does not escape apertures 150, and therefore is not deposited on the surface of substrate 160. In a second condition, hollow member 140 is held at approximately the same temperature as the bulk of the interior of manifold 110, and hollow member 140 is effective so as to minimally affect the flow of vaporized organic material to apertures 150 and thereby to the surface of substrate 160. Additional control can be attained by decreasing the heat from heating device 130 when hollow member 140 is effective in its first condition and increasing the heat from heating device 130 when hollow member 140 is effective in its second condition.

Figure 5:
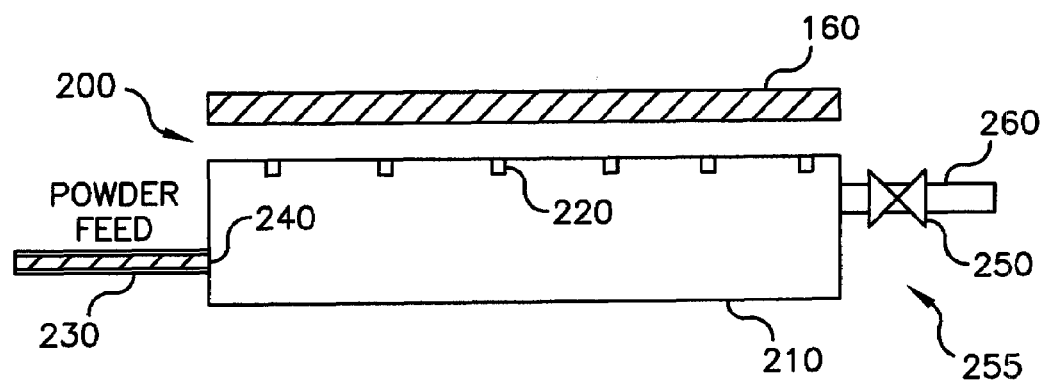
FIG. 5 shows a schematic view of another apparatus for controlling the deposition of vaporized organic material onto a substrate surface from a vaporization source in accordance with this invention.

Turning now to FIG. 5, there is shown a schematic view of another apparatus for controlling the deposition of vaporized organic material onto a substrate surface from a vaporization source in accordance with this invention. A quantity of organic material is provided into apparatus 200, which is a vaporization source. Organic material can be provided by metering device 230, such as an auger structure as already described. It will be understood that in other embodiments the organic material can also be provided in a bulk charge, of which only a portion is heated to the vaporization temperature at a given time as described above, or vaporized organic material can be provided from a heating device distant from the vaporization source. In the latter case, connection between the vaporization source is maintained above the condensation temperature of the vaporized organic material. In this embodiment heat from a heating device 240 is applied to the organic material, for example by using an auger structure to move the organic material to a permeable heated element. Thus, all organic material is contained in a single source while only a small volume percentage (less than 10%) of the initial volume of organic material is heated to the vaporization temperature at any time. This reduces the likelihood of material degradation. The organic material is vaporized by heating device 240 into manifold 210 and thereby out apertures 220, to be deposited on the surface of substrate 160 placed close to apertures 220 on the outside of manifold 210. Apparatus 200 is so constructed that the conductance of organic vapors in manifold 210 is rapid while the conductance of organic vapors through apertures 220 is slower. Apparatus 200 also includes a controller for providing independently of heating device 240 a first condition for limiting the passage of vaporized organic material through apertures 220, and a second condition for facilitating the passage of vaporized organic material through apertures 220. In apparatus 200, the controller is structure 255, which includes flow path 260 and valve 250. Structure 255 can be contiguous to or distant from manifold 210, provided that at least one of structure 255 and heating device 240 is contiguous with manifold 210. Structure 255 operates independently of heating device 240, and is effective in a first condition for limiting the passage of vaporized organic material through apertures 220, and effective in a second condition for facilitating the passage of organic material through apertures 220. The flow of vaporized organic material can be rapidly diverted from manifold 210 to a first flow path 260 by opening valve 250. In the first condition, first flow path 260 is opened by opening valve 250 so that vaporized organic material is not deposited on the surface of substrate 160. In the second condition, valve 250 is closed so as to allow organic material to be deposited on substrate 160. The deposition of vaporized organic material on the surface of substrate 160 can be rapidly started and stopped.

Figure 6:
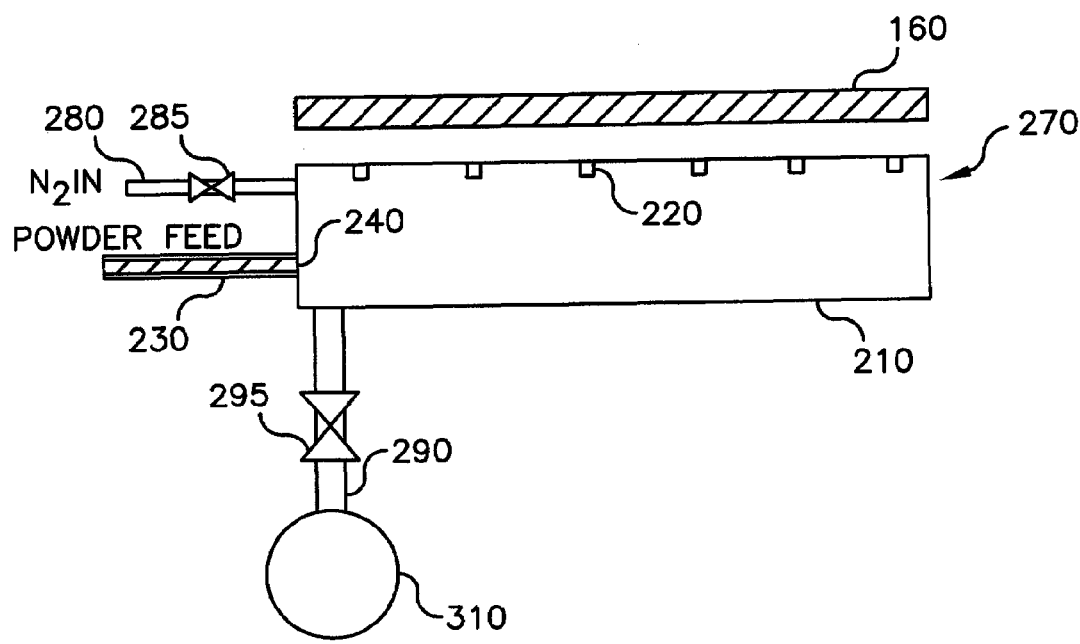
FIG. 6 shows a schematic view of another apparatus for controlling the deposition of vaporized organic material onto a substrate surface from a vaporization source in accordance with this invention.

Turning now to FIG. 6, there is shown a schematic view of another apparatus for controlling the deposition of vaporized organic material onto a substrate surface from a vaporization source in accordance with this invention. A quantity of organic material is provided into apparatus 270, which is a vaporization source. Apparatus 270 includes manifold 210 with one or more apertures 220, device for heating the organic material either contiguous to or distant from the manifold above the vaporization temperature of the organic material, a reservoir 310, a structure defining a flow path 290 connects reservoir 310 to manifold 210, and another structure connects flow path 290 to reservoir 310 so that the pressure of vaporized organic material in manifold 210 can be reduced. These will be described in further detail. Organic material can be provided by metering device 230, such as an auger structure as already described. It will be understood that the organic material can also be provided in a bulk charge, of which only a portion is heated to the vaporization temperature at a given time, as described above. Heat from heating device 240 is applied to the organic material, for example by using an auger structure to move the organic material to a permeable heating element. Thus, all organic material is contained in a single source while only a small volume percentage (less than 10%) of the initial volume of organic material is heated to the vaporization temperature at any time. This reduces the likelihood of material degradation. The organic material is vaporized by heating device 240 into manifold 210 and thereby out apertures 220, to be deposited on the surface of substrate 160 placed close to apertures 220 on the outside of manifold 210.

Apparatus 270 is so constructed that the conductance of organic vapors in manifold 210 is rapid while the conductance of organic vapors through apertures 220 is slower. Flow path 290, valve 295, reservoir 310, inert gas inlet 280, and valve 285 represent a structure operating independently of heating device 240 and are effective in a first condition for limiting the passage of vaporized organic material through apertures 220, and effective in a second condition for facilitating the passage of organic material through apertures 220. First flow path 290 is provided connected to manifold 210. Reservoir 310 is provided connectable to first flow path 290 and can serve to store diverted vaporized organic material from manifold 210, for example by providing a temperature of reservoir 310 below the condensation temperature of the diverted organic material. Apparatus 270 also includes an inert gas inlet 280 and a valve 285 for providing a supply of inert gas, e.g. nitrogen, to manifold 210. The flow of vaporized organic material can be rapidly diverted from manifold 210 to a first flow path 290 by opening valve 295. In the first condition, first flow path 290 is opened by opening valve 295, and a supply of inert gas is supplied through inert gas inlet 280 to manifold 210 by opening valve 285, so that vaporized organic material is delivered to reservoir 310. This can rapidly sweep the vaporized organic material from the interior of manifold 210. In the second condition, valves 285 and 295 are closed, closing first flow path 290 to reservoir 310, so as to allow organic material to be deposited on substrate 160. The deposition of vaporized organic material on the surface of substrate 160 can be rapidly started and stopped. One advantage of this apparatus is that it is not necessary to turn off heat source 240 to stop the flow of organic material to an external substrate. Thus, when one is ready to restart coating of an external substrate, one can simply close valves 285 and 295 and rapidly refill manifold 210 with organic material vapors.

Figure 7A:
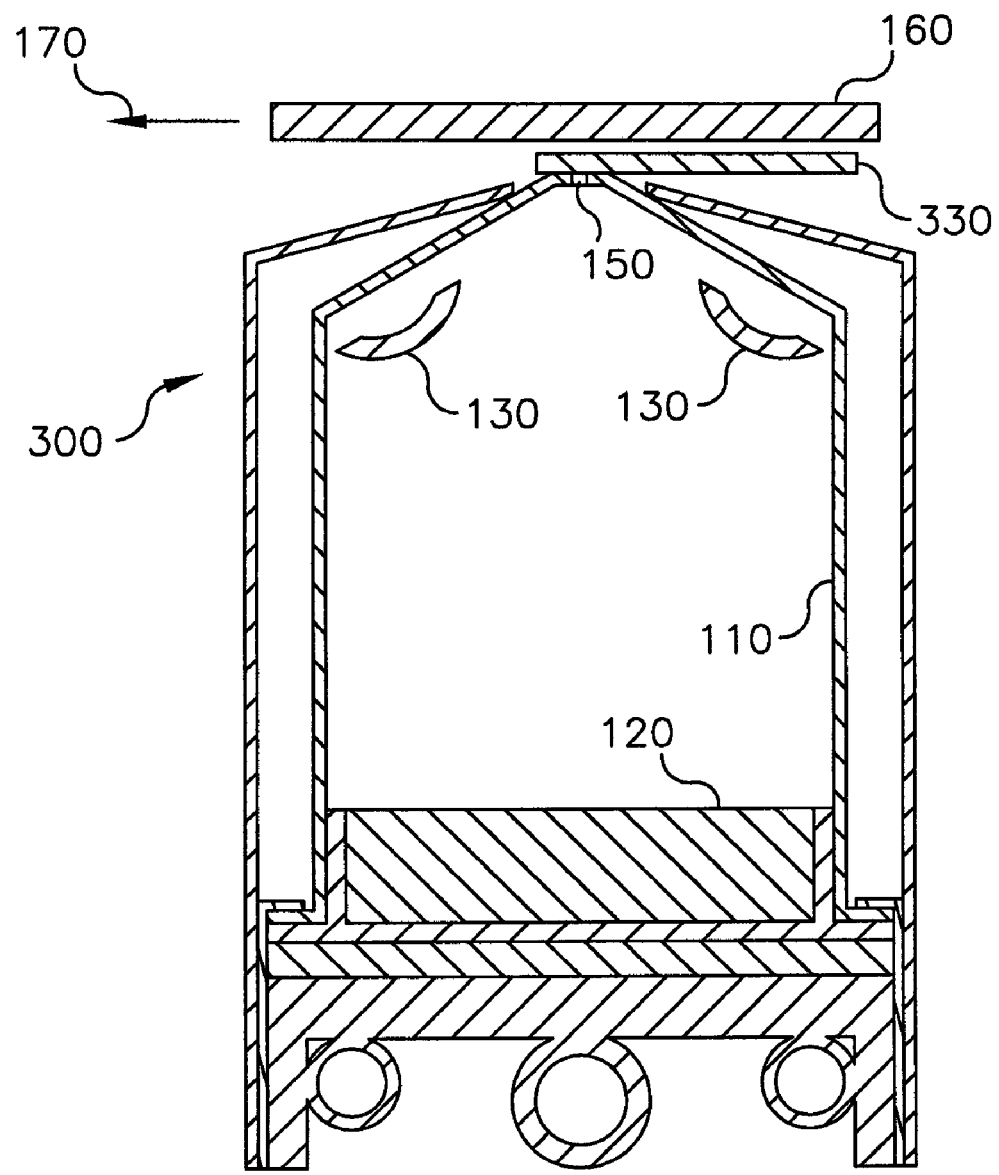
FIG. 7a shows a cross-sectional view of another apparatus in a closed configuration for controlling the deposition of vaporized organic material onto a substrate surface from a vaporization source in accordance with this invention.
Figure 7B:
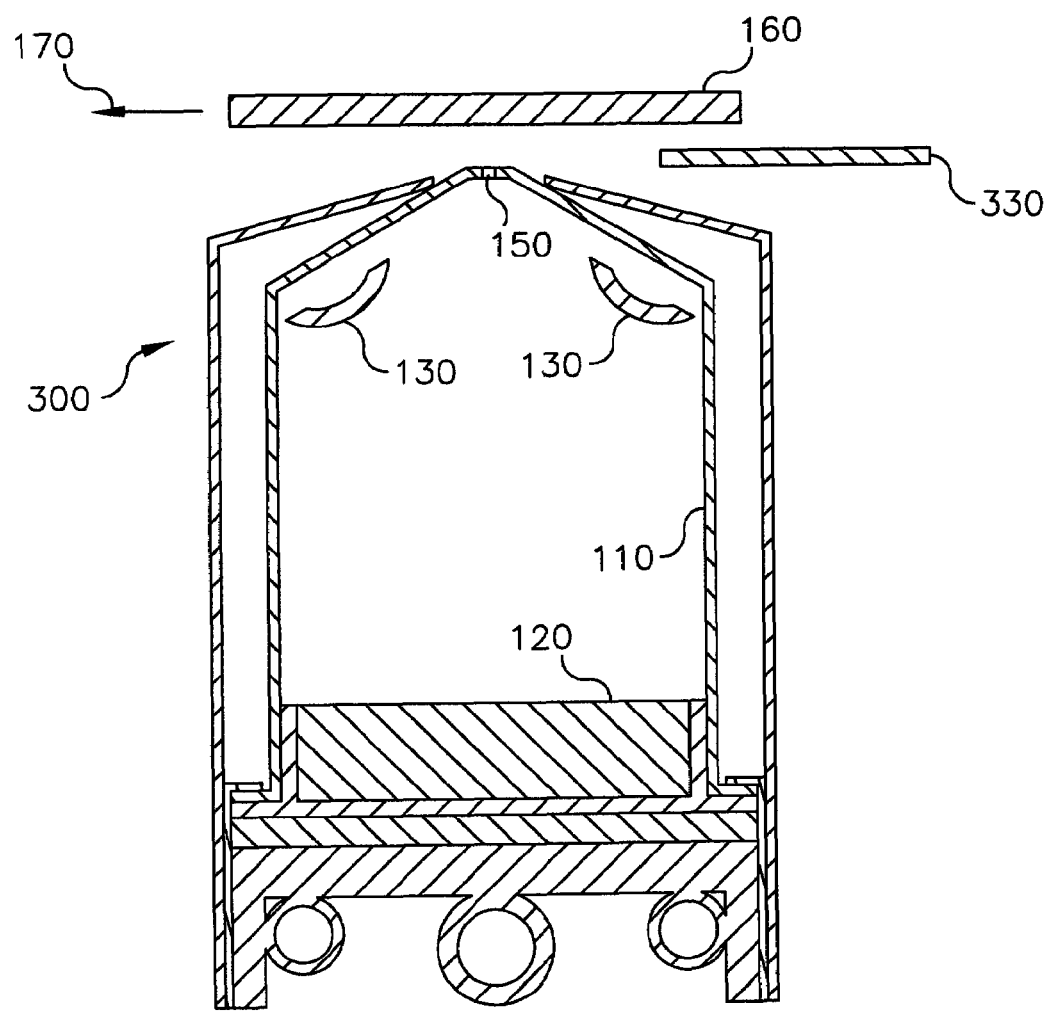
FIG. 7b shows a cross-sectional view of the above apparatus in an open configuration.

Turning now to FIGS. 7a and 7b, there is shown a cross-sectional view of an apparatus for controlling the deposition of vaporized organic materials onto a substrate surface from a vaporization source in accordance with this invention. Apparatus 300 is a vaporization source that includes manifold 110 for containing a quantity of vaporized organic material. Manifold 110 includes one or more apertures 150 through which the vaporized organic material passes for deposition onto the surface of substrate 160. Substrate 160 can be moved in direction 170 so as to sequentially coat the entire surface of substrate 160. Apparatus 300 further includes organic material 120 and a heating device 130, for example radiant heaters, to heat all or a portion of organic material 120 above its vaporization temperature. Although apparatus 300 is shown with a charge of organic material 120, it can be constructed to meter organic material into manifold 110 and heat the metered materials, for example by an auger structure and permeable heating element, as shown in other embodiments of this invention. Thus, all organic material is contained in a single source while either all of the organic material or only a small volume percentage (less than 10%) of the initial volume of organic material is heated to the vaporization temperature at any time. For embodiments where only a small volume percentage (less than 10%) of the initial volume of organic material is heated to the vaporization temperature at any time, the likelihood of material degradation is reduced.

Vaporization apparatus 300 also includes movable element 330 contiguous to the manifold. Movable element 330 is a structure operating independently of heating device 130 and is effective in a first condition for limiting the passage of vaporized organic material through apertures 150, and effective in a second condition for facilitating the passage of organic material through apertures 150. In a first position, shown in FIG. 7a, element 330 limits the flow of vaporized organic material through apertures 150. Under these conditions, vaporized organic material does not escape apertures 150, and therefore does not deposit on the surface of substrate 160. In a second position, shown in FIG. 7b, movable element 330 permits the flow of vaporized organic material through apertures 150 when it is desired to coat substrate 310. Additional control can be attained by decreasing the heat from heating device 130 when movable element 330 is effective in its first condition and increasing the heat from heating device 130 when movable element 330 is effective in its second condition.

Figure 8:
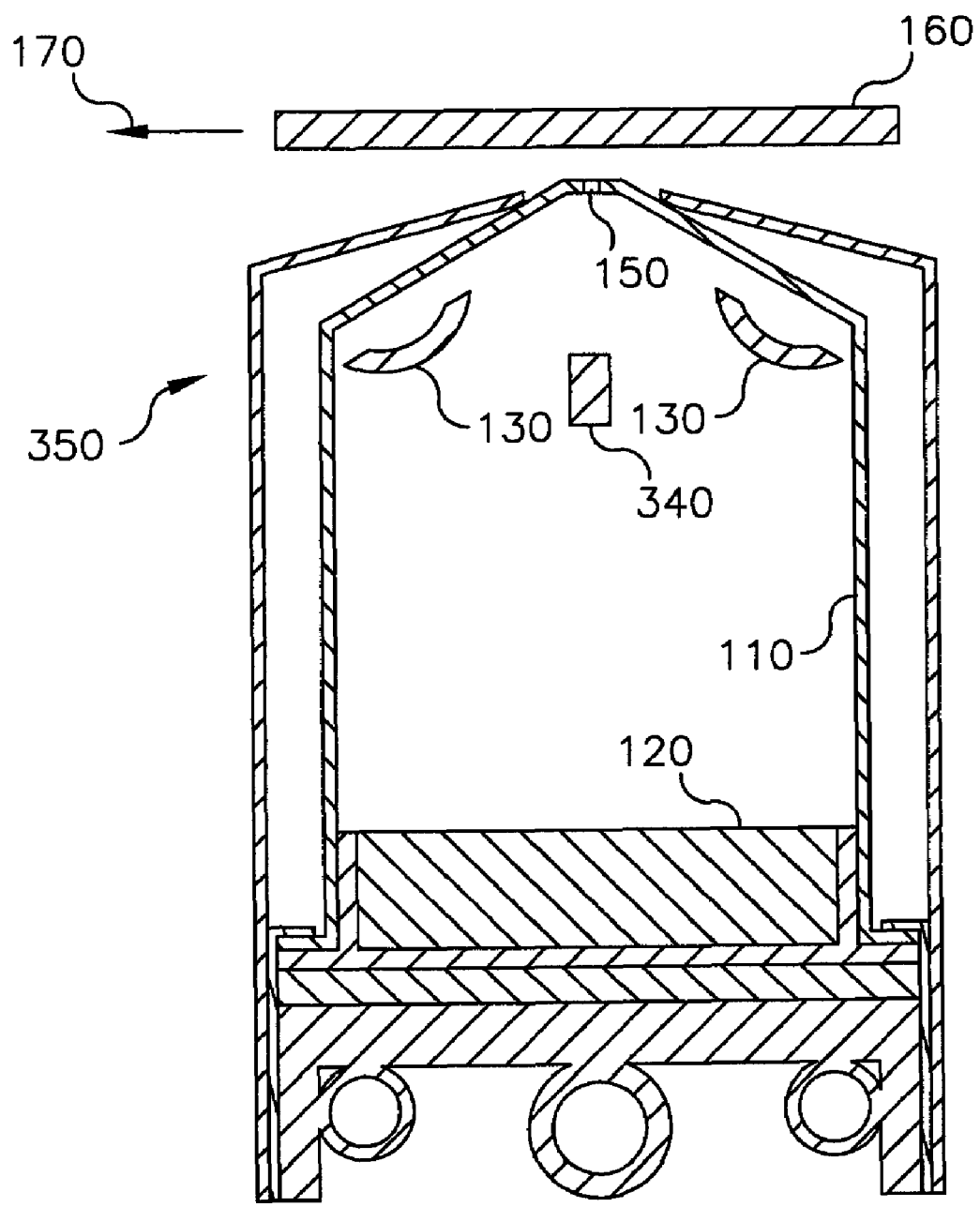
FIG. 8 shows a cross-sectional view of another apparatus in an open configuration for controlling the deposition of vaporized organic material onto a substrate surface from a vaporization source in accordance with this invention.

Turning now to FIG. 8, there is shown a cross-sectional view of another apparatus for controlling the deposition of vaporized organic material onto a substrate surface from a vaporization source in accordance with this invention. Apparatus 350 is a vaporization source similar to apparatus 300 above, except that it includes an internal movable element 340 in manifold 110. Movable element 340 can be moved via mechanics internal to manifold 110 or via a baffle manipulator that is partly outside of manifold 110. Movable element 340 can be moved into a position wherein it obstructs apertures 150 and thereby blocks the flow of organic materials through the apertures.

In addition to a single movable element one can also use a multiplicity of movable elements in a micro-electromechanical system (MEMS), wherein each individual aperture 150 has its own movable element to limit the flow of vaporized organic material. Such a MEMS system can include pistons, plungers, bimetallic ribbons, etc.

It is to be understood that movable elements as shown in these embodiments differ from the use of shutters as practiced in the prior art. Shutters that have been used to prevent the coating of a substrate are used to provide a block to the flow of vaporized organic material to the substrate. However, vaporization of the organic material continues unreduced, material vapor continues to leave the source region (i.e. effuses) and is deposited on the shutter and other surfaces not protected by the shutter. In this invention, the movable elements block the apertures through which the vaporized organic material is released to deposit onto the substrate, and thereby reduce the rate of effusion of material from the source region, while maintaining the operating pressure therein.

The invention has been described in detail with particular reference to certain preferred embodiments thereof, but it will be understood that variations and modifications can be effected within the spirit and scope of the invention.

Parts LIST 10 apparatus
20 organic material
30 first temperature-controlled region
40 heating device
50 second temperature-controlled region
60 metering device
70 radiation
80 manifold wall
100 apparatus
110 manifold
120 organic material
130 heating device
140 hollow member
150 aperture
160 substrate
170 direction
200 apparatus
210 manifold
220 apertures
230 metering device
240 heating device
250 valve
255 structure
260 flow path
270 apparatus
280 inert gas inlet
285 valve
290 flow path Parts List Con'td 295 valve
300 apparatus
310 reservoir
330 element
340 element
350 apparatus

The invention claimed is:

1. A method for controlling the deposition of vaporized organic material onto a substrate surface, comprising:
   (a) providing a heating device to produce vaporized organic material;
   (b) providing a manifold having at least one aperture through which vaporized organic material passes for deposition onto the substrate surface;
   (c) providing a controller operating independently of the heating device and effective in a first condition for limiting the passage of vaporized organic material through the aperture, and effective in a second condition for facilitating the passage of vaporized organic material through the aperture; and
   (d) wherein the heating device, or the controller, or both are contiguous to the manifold.

2. The method of claim 1 further including an element movable between a first position which limits the flow of vaporized organic material through the aperture, and a second position which permits the flow of vaporized organic material through the aperture.

3. The method of claim 1 wherein heat from the heating device is decreased when the structure is effective in its first condition and increased when the structure is effective in its second condition.

4. The method of claim 1, further including diverting the flow of vaporized organic material from the manifold by:
   (e) providing a first flow path connected to the manifold;
   (f) providing a reservoir connectable to the first flow path to store the diverted vaporized organic material; and
   (g) opening the first flow path to the reservoir in the first condition so that vaporized organic material is delivered to the reservoir, and closing the first flow path to the reservoir in the second condition.

5. The method of claim 4, wherein during the first condition providing a supply of inert gas to the manifold.

6. The method of claim 4 wherein the reservoir is at a temperature below the condensation temperature of the diverted organic material.

7. The method of claim 1, wherein the controller includes a hollow member, and further including:
   i) providing the hollow member in the manifold having a temperature-control surface in the flow path of the vaporized organic material, and such member being effective in the second condition so as to minimally affect the flow of vaporized organic material, and in the first condition to cause the deposition of vaporized organic material onto the surface of the member and not onto the surface of the substrate; and
   ii) providing material at a controlled temperature into the hollow member so as to absorb heat from or deliver heat to the temperature control surface of the hollow member.

8. The method of claim 7 further including decreasing the heat applied by the heating device.

* * * * *